United States Patent [19]

Kwan et al.

[11] Patent Number: 5,111,071
[45] Date of Patent: May 5, 1992

[54] THRESHOLD DETECTION CIRCUIT

[75] Inventors: Stephen C. Kwan, Plano; Steven C. Jones, Garland, both of Tex.

[73] Assignee: Texas Instruments Incorporated, Dallas, Tex.

[21] Appl. No.: 681,439

[22] Filed: Apr. 3, 1991

Related U.S. Application Data

[63] Continuation of Ser. No. 423,824, Oct. 19, 1989, abandoned.

[51] Int. Cl.⁵ ............................................. H03K 5/153
[52] U.S. Cl. ....................................... 307/350; 307/362
[58] Field of Search ...................... 307/350, 362, 363

[56] References Cited

U.S. PATENT DOCUMENTS

| | | | |
|---|---|---|---|
| 3,942,044 | 3/1976 | Armstrong | 307/362 |
| 4,384,219 | 5/1983 | Davis | 307/359 |
| 4,463,271 | 7/1984 | Gill, Jr. | 307/350 |
| 4,634,902 | 1/1987 | Tanaka et al. | 307/362 |

OTHER PUBLICATIONS

D. M. Taub, "Current-Threshold Circuit", IBM Technical Disclosure Bulletin vol. 17, No. 3, Aug. 1974, p. 750.

Primary Examiner—John Zazworsky
Attorney, Agent, or Firm—B. Peter Barndt; Richard Donaldson; William E. Hiller

[57] ABSTRACT

A threshold detection circuit (10) is provided which comprises an input node (12) and an output node (14). The input node (12) is coupled to a current mirror (22) through a resistor (32). The current mirror (22) is further coupled to another current mirror (16), which is arranged to receive a reference current proportional to absolute temperature. The reference current is mirrored and, having been increased by a multiplier is received by a current sink (28). When the voltage level at the input node (12) exceeds a predetermined voltage threshold level, the current exceeding the amount sinkable by the current sink (28) is directed to the base of a switching transistor (30) coupled to the output node (14), and produces an output voltage level at the output node (14) indicative of the threshold voltage level being reached an/or exceeded at the input node (12). The predetermined threshold voltage may be at a level exceeding the circuit supply voltage level and is independent of ambient operating temperature.

28 Claims, 2 Drawing Sheets

THRESHOLD DETECTION CIRCUIT

This application is a continuation of application Ser. No. 07/423,824, filed Oct. 19, 1989, now abandoned.

TECHNICAL FIELD OF THE INVENTION

This invention relates in general to the field of integrated electronic devices. More particularly, the present invention relates to an apparatus and a method for detecting a threshold voltage.

BACKGROUND OF THE INVENTION

Many threshold detecting devices are available today. Typically, threshold detection functions have been accomplished through the use of a differential comparator circuit. Such threshold detecting circuits are limited in their capabilities which correspondingly restricts their usage.

One desirable feature of a threshold detection circuit is the independence of the voltage threshold level with respect to ambient temperature. Most integrated electronic devices are designed to operate within a well defined operational temperature range.

To comply with the temperature independence requirement, more complicated circuits may be included in addition to the differential comparator circuit. With the added circuits to satisfy the above requirements, the threshold detection circuit becomes needlessly complex and cumbersome.

Another desirable feature of a threshold detection circuit is the ability to detect a threshold voltage substantially above the operating supply voltage.

In applications where the desired threshold voltage is substantially larger than the supply voltage, an auxiliary circuit, such as a resistor network, is typically required to step down the input voltage to a level below the supply voltage. This additional circuitry increases the size of the threshold detection circuit.

Accordingly, a need has arisen for a threshold detection circuit which has relatively few components, can maintain a substantially constant voltage threshold over a wide temperature range, and can detect a threshold voltage in excess of the supply voltage.

SUMMARY OF THE INVENTION

In accordance with the present invention, a threshold detection circuit is provided which substantially eliminates or reduces disadvantages and problems associated with prior threshold detection circuits.

In one aspect of the present invention, a threshold detection circuit is provided. The circuit includes an input node for receiving an input voltage and a current sink coupled to the input node. A resistive element, which determines the threshold to be detected, is further coupled to the input node. An output voltage will be provided at an output node which is responsive to the input voltage exceeding a predetermined threshold.

In another aspect of the present invention, a threshold detection circuit is provided, comprising an input node for receiving an input voltage, a first circuit coupled to a reference current, a second circuit coupled to the first circuit, the second circuit producing a first current proportional to the reference current, a current sink coupled to the first current for sinking a portion of the first current, a resistive element coupled between the input node and the second circuit and an output circuit coupled to the current sink, the output circuit providing an output voltage in response to the input voltage exceeding a predetermined threshold.

In another aspect of the present invention, the circuit includes a first current mirror to receive a reference current and to reproduce and sink a first current having a magnitude of a multiple of the reference current magnitude. A second current mirror is arranged to reproduce and source a second current having a magnitude of a multiple of the first current magnitude. Coupled with the second current mirror is a first transistor having a base, a collector and an emitter. A second transistor having a base, a collector and an emitter is coupled to the first transistor and adapted to receive any of the second current in excess of current sinkable by the first transistor.

In yet another aspect of the present invention there is provided a method for detecting a voltage threshold. The method comprises the steps of supplying an input voltage to an input node, providing a resistance at the input node, receiving a reference current, and producing a first current exceeding the reference current by a first predetermined amount. The method further includes the steps of sinking a predetermined portion of the first current. A switching element is driven with the first current in excess of the sinkable portion, and an output voltage is produced at an output node responsive to the input voltage exceeding a threshold.

In another aspect of the present invention there is provided a method for constructing a threshold detecting circuit. The method comprises the steps of forming an input node, forming a current sink coupled to the input node, forming an output node being responsive to an input voltage exceeding a predetermined threshold, and forming a resistive element coupled to the input node.

An important technical advantage of the present invention is that it provides for a circuit and method for detecting a threshold voltage at a level exceeding the supply voltage level. Another technical advantage of the present invention is the insensitivity of the threshold voltage level to ambient temperature variations.

BRIEF DESCRIPTION OF THE DRAWINGS

For a better understanding of the present invention, reference may be made to the accompanying drawings, in which.

DETAILED DESCRIPTION OF THE INVENTION

Figure 1:
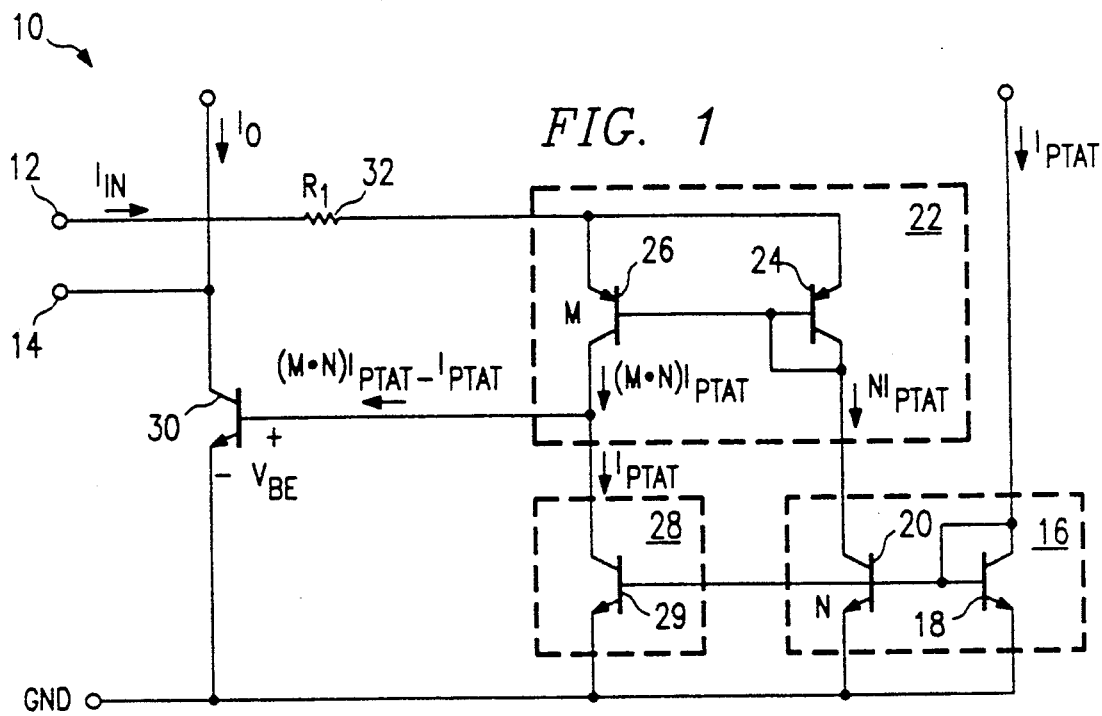
FIG. 1 is a schematic diagram of a threshold detection circuit constructed in accordance with the present invention.

With reference to the drawings, FIG. 1 illustrates a schematic diagram of a threshold detection circuit, indicated generally at 10 and constructed according to the teaching of the present invention. The circuit 10 comprises an input node 12 and an output node 14. The input node 12 is arranged to receive an input voltage, the voltage level of which the circuit 10 is monitoring.

The threshold detecting circuit 10 further comprises a first current mirror 16 including a first transistor 18 and a second transistor 20. The first transistor 18 collector is coupled to the base thereof, and the base is further coupled to the base of the second transistor 20. The emitters of the first and second transistors 16, 18 are coupled to one another. The first and second transistors 18, 20 are constructed such that they exhibit substantially identical transfer characteristics, with the exception that the second transistor 20 is sized to be N times larger than the first transistor 18, where N is a predetermined factor. The sizing is accomplished, for example, by forming the second transistor 20 to have an emitter N times larger in area than the emitter of the first transistor 18. The first and second transistors 18, 20 are shown to be NPN-type bipolar junction transistors, but the present invention is also operable with PNP-type transistors as known in the art.

The first current mirror 16 is arranged to receive a reference current $I_{PTAT}$, and to mirror and sink a current of the magnitude $NI_{PTAT}$. $I_{PTAT}$ flows into the collector of the first transistor 18 and $NI_{PTAT}$ flows into the collector of the second transistor 20. The N factor of $NI_{PTAT}$ is due to the sizing of the first transistor 18 and the second transistor 20.

A second current mirror 22 is coupled to the first current mirror 16 so that the current $NI_{PTAT}$ is mirrored again. The second current mirror 22 includes a third transistor 24 and a fourth transistor 26 with their bases coupled together. The collector of the third transistor 24 is further coupled to the bases thereof. The emitters of the third transistor 24 and the fourth transistor 26 are coupled to one another. The third and fourth transistors 24, 26 also have substantially identical transfer characteristics, with the exception that the fourth transistor 26 has an emitter M times the size of the third transistor 24. Since the current flowing out of the collector of the third transistor 24 and into the collector of the second transistor 20 is $NI_{PTAT}$, the current flowing out of the collector of the fourth transistor 26 is $(M \times N)I_{PTAT}$, the fourth transistor 26 being M times larger than the third transistor 24.

A current sink 28 is arranged to receive a portion of the current $(M \times N)I_{PTAT}$ flowing out of the collector of the fourth transistor 26. The current sink 28 includes a transistor 29 having a collector connected to the collector of the fourth transistor 26. The base of the transistor 29 is connected to the base of the first and second transistors 18, 20. The maximum amount of current sinkable by the current sink 28 is configured to be $I_{PTAT}$. Any excess current of the magnitude $(M \times N)I_{PTAT} - I_{PTAT}$ provides a base drive current to a fifth transistor 30. The fifth transistor 30, when driven by the base current, provides an output voltage level at the output node 14.

In order for the fifth transistor 30 to switch states, the base current of the fifth transistor 30 must be large enough to drive the fifth transistor 30 into the active region. It follows that the collector current flowing out of the fourth transistor 26 in excess of the current sinkable by the current sink 28 must provide this base drive current. For the base of the fifth transistor 30 to begin to receive current, $I_{IN}$ coming into the input node 12 must satisfy the sum of the current $I_{PTAT}$ flowing into the current sink 28, and the current $NI_{PTAT}$ flowing into the first current mirror 16. The threshold voltage level at which the circuit 10 changes state is equal to the sum of the base to emitter voltage $V_{BE}$ of the fifth transistor 30, the saturation voltage $V_{SAT}$ of the fourth transistor 26, and the voltage drop across a resistor 32 having the value $R_1$, as expressed below:

$$V_{TH} = V_{BE} + V_{SAT} + (I_{TH} \cdot R_1). \tag{1}$$

where $I_{TH}$ is the input current at threshold, and $R_1$ is the resistance of a resistor 32 coupled between the input node 12 and the second current mirror 22. As is apparent in Equation (1) above, the threshold voltage $V_{TH}$ can be adjusted by changing the value $R_1$ of the resistor 32 without changing the threshold current $I_{TH}$.

The threshold current $I_{TH}$ is defined as the input current when the base of the fifth transistor 30 begins to receive current. Therefore, this threshold current is the one branch of the first current mirror 16:

$$I_{TH} = I_{PTAT} + NI_{PTAT} \tag{2}$$

The current $I_{PTAT}$ is proportional to absolute temperature in degrees Kelvin. This temperature dependent current $I_{PTAT}$ is created using circuitry known in the art such that its magnitude is proportional to the junction temperature of the device. As discussed below, the $I_{PTAT}$ temperature characteristics contribute to the invariance of the voltage threshold of the threshold detection circuit 10.

Figure 2:
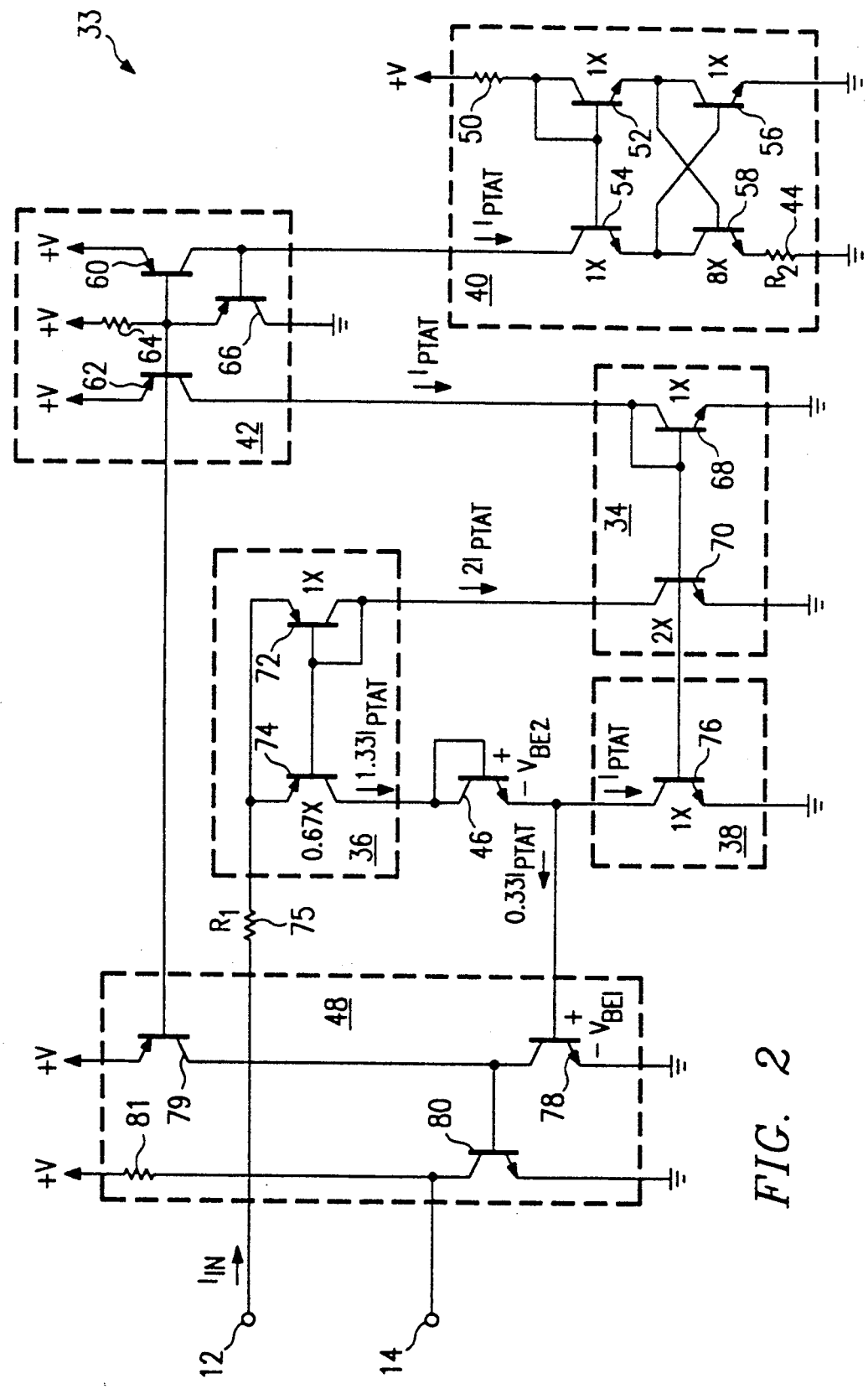
FIG. 2 is a schematic diagram of one embodiment of the present invention.

FIG. 2 illustrates an embodiment of the present invention indicated generally at 33. The circuit 33 shown may be divided into six functional circuit blocks for the purpose of discussion. First and second current mirrors 34, 36 and a current sink 38 are substantially the same structure as the first and second current mirrors 16, 22 and the current sink 28 shown in FIG. 1 and discussed above.

A reference current generator circuit 40 used to generate the current $I_{PTAT}$ proportional to absolute temperature. A current mirror 42 is used to supply the current $I_{PTAT}$ to the first current mirror 34. $I_{PTAT}$ can be expressed in terms of the absolute junction temperature:

$$I_{PTAT} = \frac{kT}{qR_2} \ln N, \tag{3}$$

where k is the Boltzman constant, T is the absolute junction temperature in degrees Kelvin, q is the unit charge of an electron, N is the ratio of the sizes of the transistor emitters, and $R_2$ is the resistance value of a resistor 44 used in the reference current generator circuit 40.

As shown previously with reference to FIG. 1, the current $I_{PTAT}$ generated by the circuit 40 and current mirror 42 is received by the first current mirror 34. In this embodiment, the emitter area ratio of the first current mirror transistors 68, 70 is two to one, which induces a current of the magnitude $2I_{PTAT}$ to flow from the second current mirror 36 into the first current mirror 34. Similarly, the transistor emitter area ratio in the second current mirror 36 is 0.67 to 1. The current sourced by the second current mirror 36 is then $2I_{PTAT}$ times 0.67, which equals $1.33I_{PTAT}$. A diode-connected transistor 46 has its base connected to its collector and is arranged to receive the $1.33I_{PTAT}$ from the second current mirror 36. A current sink 38, capable of sinking a current of the magnitude $I_{PTAT}$, is coupled to the emitter of the diode-connected transistor 46. An output stage 48 is arranged to receive the excess current from the second current mirror 36 and to provide an output voltage indicative of threshold voltage detection. The detailed structure and function of the present embodiment of the invention is described below.

The reference current generator circuit 40 is connected to a supply voltage through a first resistor 50. The first resistor 50 is connected to the collector of a first transistor 52. The collector and the base of the first transistor 52 are coupled together and to the base of a second transistor 54. The emitter of the first transistor 52 is also coupled to the collector of a third transistor 56 and to the base of a fourth transistor 58. The base of the third transistor 56 is coupled to the collector of the fourth transistor 58, which is also coupled to the emitter of the second transistor 54. The emitter of the fourth transistor 58 is coupled to a resistor 44 having a resistance value $R_2$. The fourth transistor 58 is sized to be eight times the size of each of the first, second and third transistors 52, 54, 56. The resistor 44 value $R_2$ plays an important role in determining the threshold voltage level detected by circuit 33.

A current having a magnitude $I_{PTAT}$ is generated by the reference current generator circuit 40 and mirrored by a current mirror 42. The current mirror 42 includes a fifth transistor 60 with its emitter coupled to a supply voltage. The collector of the fifth transistor 60 is coupled to the collector of the second transistor 54 of the reference current generator circuit 40. The base of a sixth transistor 62 is coupled to the base of the fifth transistor 60, and is further coupled to a supply voltage through a resistor 64. The resistor 64 is further coupled to the emitter of a seventh transistor 66, which has a base connected to the collector of the fifth transistor 60 and a collector connected to ground. Therefore, the current generated by the reference current generator circuit 40 is sourced from the collector of the fifth transistor 60 of the current mirror 42. The collector of the sixth transistor 62 is coupled to the first current mirror 34 of the threshold detection circuit 33 to provide the reference current $I_{PTAT}$.

The threshold detection circuit 33 as illustrated in FIG. 2 is comparable to the circuit 10 shown in FIG. 1. The first current mirror 34 comprises a first transistor 68 and a second transistor 70. The collector and base of the first transistor 68 are coupled together along with the base of the second transistor 70. The emitters of the first and second transistors 68, 70 are coupled to ground. The second transistor 70 is sized to be two times the size of the first transistor 68 and therefore the current induced in the collector of the second transistor 70 is $2I_{PTAT}$. Thus, the second current mirror 36, being coupled to the first current mirror 34, is induced to source a current of the magnitude $2I_{PTAT}$ to the first current mirror 34.

The second current mirror 36 has a first transistor 72 and a second transistor 74 with their bases coupled together. The base of the first transistor 72 is also coupled to the collector thereof. The second transistor 74 is sized to be 0.67 times the size of the first transistor 72. As previously disclosed, the sizing is by means of the difference in emitter area sizes. The amount of current sourced by the second transistor 74 is 0.67 times $2I_{PTAT}$ which is equal to $1.33I_{PTAT}$. The emitters or both the first and second transistors 72, 74 are coupled to the input node 12 through a resistor 75 having a resistance value $R_1$.

A transistor 46 is coupled in series to the collector of the second transistor 74 of the second current mirror 36. The base of the transistor 46 is connected to the collector thereof, arranged like a diode. The emitter of the transistor 46 is coupled to a current sink 38 comprising a transistor 76. The transistor 76 is configured to receive and sink a current, having a magnitude of $I_{PTAT}$, from the second current mirror 36 and the transistor 46.

The output stage 48 is coupled to the current sink 38 and includes first, second and third transistors 78, 79, 80. The collector of the first transistor 78 of the output stage 48 is coupled to the collector of the second transistor 79. The emitter of the second transistor 79 is coupled to a supply voltage while the emitter of the first transistor 78 is connected to ground. The collector of the first transistor 78 is further coupled to the base of the third transistor 80. The second transistor 79 base is coupled to the bases of matched transistors 60, 62 of the current mirror 42. The collector of the third transistor 80 is coupled to the supply voltage through a resistor 81 while the emitter thereof is connected to ground. The base of the first transistor 78 is coupled to the collector input of the current sink 38 and configured to receive any excess current from the second current mirror 36 that the current sink 38 cannot sink.

As is apparent from FIG. 2 and Equation (2), the input current $I_{IN}$ reaches threshold value when it is equal to the collector current of the current sink 38 added to the collector current of the second transistor 70 of the first current mirror 34. Therefore, $I_{TH}$ is the sum of $I_{PTAT}$ plus $2I_{PTAT}$, which is $3I_{PTAT}$. Any input current exceeding $3I_{PTAT}$ is operable to drive the base of the first transistor 78 of the output stage 48, which in turn causes the transistor 80 to go into the cutoff region and thereby giving rise to a change of state of the output node 14.

In the present embodiment of the invention shown in FIG. 2, the threshold voltage level can be described as the sum of the base to emitter voltages of the first transistor 78 and the diode-connected transistor 46, in addition to the saturation voltage of the second transistor 74 and the voltage drop across the resistor 75:

$$V_{TH} = V_{BE1} + V_{BE2} + V_{SAT} + (I_{TH} \cdot R_1) \tag{4}$$

The saturation voltage of the second transistor 74 of the second current mirror 36 may be ignored because it contributes negligibly to the sum. Substituting for $I_{TH}$ in Equation (4) and assuming that $V_{BE1} = V_{BE2}$, the threshold voltage $V_{TH}$ can be expressed as:

$$\begin{aligned} V_{TH} &= V_{BE1} + V_{BE2} + \frac{R_1}{R_2} \cdot \frac{3kT}{q} \ln N \\ &= 2V_{BE} + \frac{R_1}{R_2} \cdot \frac{3kT}{q} \ln N \end{aligned} \tag{5}$$

In this case $N = 8$, which is established by fourth transistor 58 emitter sizing of the current generator circuit 40.

It may be appreciated that the temperature characteristics of the threshold voltage is dependent on the temperature characteristics of each term to the right of the equal sign in Equation (5). A transistor's base to emitter voltage temperature characteristic is fairly predictable, and is typically $-2$ mV/°C. Differentiating the expression in Equation (5) with respect to temperature and setting it to zero yields an equation which may be solved to indicate where the change in threshold voltage with respect to temperature is a minimum. The derivative is shown in equation (6):

$$\frac{dV_{TH}}{dT} = 0 = -4mV/°C. + \frac{R_1}{R_2} \cdot \frac{3k}{q} \ln N/°C. \quad (6)$$

Rearranging the above equation, it becomes apparent that the resistance values $R_1$ and $R_2$ of the resistors 75, 44 in the circuit 33 may be adjusted to compensate for the temperature variance in the base to emitter voltage of the transistors 46, 78:

$$4mV/°C. = \frac{R_1}{R_2} \cdot \frac{3k}{q} \ln N/°C. \quad (7)$$

Given a known resistance value $R_2$ for resistor 44 and N, an optimum resistance value $R_1$ for resistor 75 may be found from manipulating the expression in Equation (7) that minimizes or eliminates the temperature dependence of the threshold detection circuit 33.

As indicated in Equation (4), the threshold voltage level is determined by the sum of the base to emitter voltage $V_{BE}$ of multiple transistors 46, 78, a negligible saturation voltage, and the voltage drop across resistor 75. Therefore, the threshold voltage level can be modified by varying the number of base to emitter voltages $V_{BE}$ between the second transistor 74 of the second current mirror 36 and the first transistor 78 of the output stage 48. In the embodiment illustrated in FIG. 2, only one $V_{BE}$ is between those transistors 74, 78. Moreover, an integer multiple of diode-connected transistors, like transistor voltage level $V_{TH}$. In applications where non-integer multiples of the $V_{BE}$ is desired, a circuit, indicated generally at 82 and shown in FIG. 3, may be used.

Figure 3:
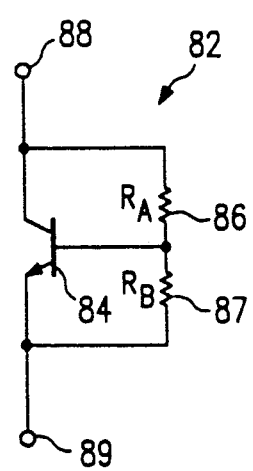
FIG. 3 is a schematic diagram of a portion of an alternative embodiment of the present invention.

Referring to FIG. 3, circuit 82 includes a transistor 84 having a first resistor 86 connected between its collector and base, and a second resistor 87 connected between its base and emitter. A node 88 connected to the collector of the transistor 84 may be coupled to the second current mirror 36, and a node 89 connected to the emitter may be coupled to the current sink 38. The first resistor 86 has a resistance value $R_A$ and the second resistor 87 has a resistance value $R_B$. The multiplier for the $V_{BE}$, f, is equal to the expression in Equation (8):

$$f = \frac{R_A + R_B}{R_B} \quad (8)$$

Thus, both the first and second resistors 86, 87 may be chosen at desired resistance values to effect a non-integer effective $V_{BE}$.

Figure 4:
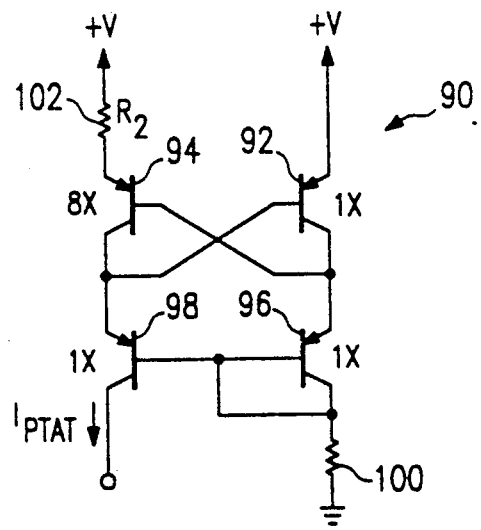
FIG. 4 is a schematic diagram of a reference current supplying circuit.

Referring now to FIG. 4, an alternate embodiment of the current generator circuit 40 of FIG. 2 is shown. The circuit, indicated generally at 90, employs PNP-type transistors and may be used to substitute for both the current generator circuit 40 and the current mirror 42 shown in FIG. 2. The circuit 90 includes a first transistor 92 with its base coupled to the collector of a second transistor 94 and its collector coupled to the emitter of a third transistor 96. The collector of the second transistor 94 is further coupled to the emitter of a fourth transistor 98, and the base of the second transistor 94 is connected to the collector of the first transistor 92. The collector of the third transistor 96 is coupled to a resistor 100. The emitter of the second transistor 94 is coupled to a supply voltage through a resistor 102 of a resistance value $R_2$. The second transistor 94 emitter is sized to be eight times larger than the emitter of the fourth transistor 98. A current $I_{PTAT}$, which is proportional to temperature variances, is generated by the circuit 90 and flows from the collector of transistor 98. The circuit 90 generally functions like that of the current generator circuit 40. Due to the nature of the PNP transistors, the current mirror circuit 42 may be eliminated, and the current generator circuit 90 may be coupled directly to the first current mirror 16 of the threshold detection circuit 10 of FIG. 1 or the first current mirror 34 of the threshold detection circuit 33 of FIG. 2.

In summary, it is apparent from examining Equation (4) that the threshold voltage level is independent of the supply voltage value. Therefore, the threshold detection circuits constructed in accordance with the present invention are capable of detecting voltages far exceeding the supply voltage level. It is also apparent that by varying the number of diode-connected transistors connected between the second current mirror 36 and the switching transistor 78, and further by adjusting the resistance value $R_1$ of the resistor 75, the threshold voltage level of the circuit may be established at a desired level. Thus, the circuit threshold characteristics may be changed by modifying a relatively small number of circuit components.

An additional feature of the a circuit under the present invention is the availability of a high impedance state at its input node 12. Note that no input current $I_{IN}$ can flow into the circuit 10 unless the transistors of the second current mirror 22 or 36 are provided with base current. Therefore, a high impedance state can be achieved by disabling the $NI_{PTAT}$ current to second current mirror 22 or 36. For example, $I_{PTAT}$ may be disabled or otherwise redirected to ground in order to disable $NI_{PTAT}$ thereby creating a high impedance state.

Other modifications to the circuit provided herein are possible without departing from the scope of the present invention. For example, the construction of current mirrors, current sources and current sinks may be varied according to circuit applications. In addition, there are a variety of methods of creating the current proportional to temperature, $I_{PTAT}$. The presentation of the specific embodiment as illustrated in FIG. 2 is solely for the purpose of teaching important technical advantages of the present invention and should not be construed to limit the scope of the present invention.

Although the present invention has been described in detail, it should be understood that various changes, substitutions and alterations can be made hereto without departing from the spirit and scope of the invention as defined by the appended claims.

What is claimed is:

1. A threshold detection circuit comprising:
    an input node for receiving an input voltage;
    a first circuit coupled to a reference current;
    a second circuit coupled to said first circuit, said second circuit producing a first current proportional to said reference current, wherein said first current is larger than said reference current;
    a current sink coupled to said first current for sinking a portion of said current;
    a resistive element coupled between said node and said second circuit; and
    an output circuit coupled to said current sink, said output circuit providing an output voltage in response to said input voltage exceeding a predetermined threshold.

2. The threshold detection circuit, as set forth in claim 1, wherein said switching circuit is coupled to said output mode, said switching circuit being responsive to said first current having a magnitude larger than the current sinkable by said current sink.

3. The threshold detection circuit, as set forth in claim 1, wherein said switching circuit includes a first transistor having a base, a collector and an emitter, the base thereof coupled to said current sink and arranged to receive a portion of said first current.

4. The threshold detection circuit, as set forth in claim 3, wherein said switching circuit further comprises a second transistor having a base, a collector and an emitter, the collector thereof coupled to said output node, and the base thereof coupled to the collector of said first transistor, said second transistor being responsive to said first transistor receiving said portion of said first current and producing an output voltage at said output node.

5. The threshold detection circuit, as set forth in claim 1, further comprising at least one transistor having a base, a collector and an emitter, said collector and said base coupled to said second circuit and said emitter coupled to said current sink.

6. The threshold detection circuit, as set forth in claim 5, wherein said transistor base is coupled to said collector thereof.

7. The threshold detection circuit, as set forth in claim 5, further comprising:
   a first resistor coupled between said base and collector of said transistor; and
   a second resistor coupled between said base and emitter of said transistor.

8. The threshold detection circuit, as set forth in claim 1, wherein said reference current is proportional to absolute temperature.

9. The threshold detection circuit, as set forth in claim 1, wherein said predetermined threshold is proportional to a resistance of said resistive element.

10. The threshold detection circuit, as set forth in claim 1, wherein said input node exhibits high input impedance characteristics in response to the reference current being less than a predetermined value.

11. A threshold detection circuit comprising:
   an input node;
   a first current mirror for receiving a reference current and generating a first current having a magnitude of a first predetermined multiple of said reference current;
   a second current mirror coupled to said first current mirror and generating a second current having a magnitude of a second predetermined multiple of said first current;
   a current sink coupled to said second current mirror and arranged to sink a predetermined amount of said second current;
   a resistor coupled between said input node and said second current mirror; and
   a switching circuit coupled to said second current mirror and said current sink, said switching circuit being responsive to said input node having at least a predetermined threshold voltage level.

12. The threshold detection circuit, as set forth in claim 11, wherein said first current mirror comprises:
   a first transistor having a base, an emitter and a collector, said base and collector coupled together;
   a second transistor having a base, an emitter and a collector, said base coupled with said base of said first transistor; and
   said second transistor emitter area being a first predetermined multiple of the area of said first transistor emitter.

13. The threshold detection circuit, as set forth in claim 12, wherein said second current mirror comprises:
   a third transistor having a base, an emitter and a collector, said base and collector coupled together, and said collector coupled to said second transistor collector;
   a fourth transistor having a base, an emitter and a collector, said base coupled with said third transistor base; and
   said fourth transistor emitter area being a second predetermined multiple of the area of said third transistor emitter.

14. The threshold detection circuit, as set forth in claim 12, wherein said current sink comprises a third transistor having a base, an emitter and a collector, said third transistor base coupled with said first and second transistor bases.

15. The threshold detection circuit, as set forth in claim 11, further comprising at least one transistor having a base, a collector and an emitter, said transistor coupled between said second current mirror and said current sink.

16. The threshold detection circuit, as set forth in claim 15, wherein said transistor base is coupled to the collector thereof.

17. The threshold detection circuit, as set forth in claim 15, further comprising:
   a first resistor coupled between said base and collector of said transistor; and
   a second resistor coupled between said base and emitter of said transistor.

18. The threshold detection circuit, as set forth in claim 11, wherein said switching circuit includes a first transistor having a base, a collector and an emitter, the base thereof coupled to said current sink and arranged to receive a portion of said second current.

19. The threshold detection circuit, as set forth in claim 18, further comprising a second transistor having a base, a collector and an emitter, the collector thereof coupled to the collector of said first transistor, and the emitter thereof coupled to a supply voltage.

20. The threshold detection circuit, as set forth in claim 19, further comprising a third transistor having a base, a collector and an emitter, the base thereof coupled to the collector of said first transistor, and output node coupled to the collector of said third transistor.

21. The threshold detection circuit, as set forth in claim 11, wherein said reference current is proportional to absolute temperature.

22. The threshold detection circuit, as set forth in claim 11, wherein said threshold voltage level is adjustable by varying the value of said resistor.

23. The threshold detection circuit, as set forth in claim 11, being operable to detect a threshold voltage level exceeding a circuit supply voltage level.

24. The threshold detection circuit, as set forth in claim 11, wherein said input node exhibits high input impedance characteristics in response to said reference current being less than a predetermined value.

25. A threshold detection circuit comprising:
   an input node for receiving an input voltage;

a first resistor coupled in series with said input node;

a first current mirror arranged to receive a reference current and to reproduce and sink a first current having a magnitude of a multiple of said reference current;

a second current mirror coupled to said first current mirror and adapted to reproduce and source a second current having a magnitude of a multiple of said first current magnitude, said second current mirror coupled with said resistor;

a first transistor having a base, a collector and an emitter, said collector coupled with said second current mirror, said first transistor adapted to sink a predetermined amount of said second current;

a second transistor having a base, a collector and an emitter, said base coupled to said first transistor collector and adapted to receive any of said second current in excess of current sinkable by said first transistor;

a third transistor having a base, a collector and an emitter, said base coupled with said second transistor collector; and an output node coupled to said third transistor collector, said output node providing an output voltage responsive to said input voltage exceeding a predetermined threshold.

26. A method for detecting a threshold, said method comprising the steps of:

supplying an input voltage to an input node;

providing a resistive element coupled to said input node;

receiving a reference current;

producing a first current which is a predetermined multiple of said reference current;

drawing a second current through said resistive element which is a predetermined multiple of said first current;

sinking a predetermined portion of said second current;

driving a switching circuit with a portion of said first current in excess of said sink portion; and producing an output voltage at an output node coupled to said switching circuit, said output voltage being responsive to said input voltage exceeding said threshold.

27. The method, as set forth in claim 26, wherein said step of providing a resistive element comprises selecting a resistance value whereby said threshold is proportional to said resistance value.

28. A method for constructing a threshold detecting circuit, said method comprising the steps of:

providing an input node having an input voltage;

providing a resistive element coupled to said input node;

forming a first circuit for receiving a reference current and producing a first current proportional to said reference current in magnitude;

forming a second circuit coupled to said resistive element for receiving said first current and drawing a second current through said resistive element proportional to said first current in magnitude;

forming a current sink arranged to sink a portion of said second current; and providing an output node coupled to said current sink, said output node providing an output voltage responsive to said input voltage exceeding a predetermined threshold.

* * * * *